United States Patent
Jung

(10) Patent No.: US 10,332,464 B2
(45) Date of Patent: Jun. 25, 2019

(54) ARRAY SUBSTRATE, DISPLAY DEVICE AND METHOD FOR DRIVING THE SAME

(71) Applicant: BOE TECHNOLOGY GROUP CO., LTD., Beijing (CN)

(72) Inventor: Chulgyu Jung, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/692,511

(22) Filed: Aug. 31, 2017

(65) Prior Publication Data

US 2018/0190217 A1 Jul. 5, 2018

(30) Foreign Application Priority Data

Jan. 3, 2017 (CN) .......................... 2017 1 0001331

(51) Int. Cl.
*G09G 3/36* (2006.01)
*G02F 1/1362* (2006.01)
(Continued)

(52) U.S. Cl.
CPC ..... *G09G 3/3611* (2013.01); *G02F 1/133377* (2013.01); *G02F 1/133514* (2013.01); *G02F 1/136277* (2013.01); *G02F 1/136286* (2013.01); *G09G 3/3413* (2013.01); *G09G 3/364* (2013.01); *G09G 3/3607* (2013.01); *H01L 27/1218* (2013.01); *G02F 2201/52* (2013.01); *G09G 2300/0426* (2013.01);
(Continued)

(58) Field of Classification Search
CPC ................................................. G02F 1/136286
See application file for complete search history.

(56) References Cited

U.S. PATENT DOCUMENTS

| 2011/0085098 A1* | 4/2011 | Liao ...................... G09G 3/3614 |
| | | 349/37 |
| 2012/0307174 A1* | 12/2012 | Lee ....................... G09G 3/2003 |
| | | 349/54 |

(Continued)

FOREIGN PATENT DOCUMENTS

CN 106057164 A 10/2016

OTHER PUBLICATIONS

First Office Action for Chinese Application No. 201710001331.0, dated Nov. 1, 2018, 5 Pages.

*Primary Examiner* — Edmond C Lau
(74) *Attorney, Agent, or Firm* — Brooks Kushman P.C.

(57) ABSTRACT

An array substrate includes a base substrate, rows of gate lines on the base substrate, columns of data lines on the base substrate, and an array of sub-pixels defined by the gate lines and the data lines. The sub-pixels include first monochrome sub-pixels, second monochrome sub-pixels, third monochrome sub-pixels and white sub-pixels. Monochromatic lights from the first monochrome sub-pixels, the second monochrome sub-pixels and the third monochrome sub-pixels are capable of being mixed into white light. The gate lines are divided into a first kind of gate lines and a second kind of gate lines depending on whether an ordinal number of each of the rows of gate lines is an odd number or an even number. The monochrome sub-pixels are driven by the first kind of gate lines, and the white sub-pixels are driven by the second kind of gate lines.

18 Claims, 4 Drawing Sheets

(51) Int. Cl.
*H01L 27/12* (2006.01)
*G02F 1/1333* (2006.01)
*G09G 3/34* (2006.01)
*G02F 1/1335* (2006.01)

(52) U.S. Cl.
CPC .............. *G09G 2300/0452* (2013.01); *G09G 2310/0224* (2013.01); *G09G 2310/0235* (2013.01)

(56) References Cited

U.S. PATENT DOCUMENTS

| | | | |
|---|---|---|---|
| 2016/0155400 A1* | 6/2016 | Namkung | G09G 3/3614 345/205 |
| 2017/0116940 A1* | 4/2017 | Wang | G09G 3/3648 |
| 2018/0182317 A1 | 6/2018 | Cui et al. | |

\* cited by examiner

ARRAY SUBSTRATE, DISPLAY DEVICE AND METHOD FOR DRIVING THE SAME

CROSS-REFERENCE TO RELATED APPLICATION

This application claims priority to Chinese patent application No. 201710001331.0 filed on Jan. 3, 2017, which is incorporated herein by reference in its entirety.

TECHNICAL FIELD

The present disclosure is related to the field of displaying technology, and in particular to an array substrate, a display device and a method for driving the same.

BACKGROUND

An FSC (Field Sequential Color) thin film transistor (TFT) liquid crystal display (LCD) device generally includes a liquid crystal display panel, having a plurality of gate lines and data lines crossing each other and thin film transistors arranged at crossing parts of the data lines and the gate lines for driving liquid crystal, a source driving IC (circuit) for generating scan drive signals for driving the data lines of the liquid crystal display panel, a gate driver IC for generating signals for driving the gate lines of the liquid crystal display panel, and a timing controller for generating scan drive signals for driving the gate driver IC and load signals and data signals for driving the source driving IC.

In addition, in order to show RGB colors, the FSC type LCD device further includes multiple red LEDs, multiple green LEDs and multiple LEDS as a background light source, and a memory for storing and reading frame data. The source driving IC and the gate driver IC receive a carry signal and a carry shift direction changeover signal from the timing controller, and shift a carry left and right (up and down). Thus, in the FSC type liquid crystal display device, one frame data is divided into R, G and B sub-frames, and each frame has ⅓ of a main-frame time, and this results in that the charging time of sub-pixels is not sufficient, thereby affecting display effect of the display device. Further, since the RGB sub-pixels are sequentially driven, at least 3 times of the reaction speed of liquid crystal is required. In addition, color mixing and color break up may occur due to the low reaction speed of liquid crystal.

SUMMARY

Embodiments of the present disclosure provide an array substrate and a display device, which can increase charging time of sub-pixels and then improving display effect of the display device.

Technical solutions of the present disclosure are as follows.

According to one aspect, an array substrate is provided and includes a base substrate, rows of gate lines on the base substrate, columns of data lines on the base substrate, and an array of sub-pixels defined by the gate lines and the data lines. The sub-pixels include first monochrome sub-pixels, second monochrome sub-pixels, third monochrome sub-pixels and white sub-pixels, and monochromatic lights emitted from the first monochrome sub-pixels, the second monochrome sub-pixels and the third monochrome sub-pixels are capable of being mixed into white light. The gate lines are divided into a first kind of gate lines and a second kind of gate lines depending on whether an ordinal number of each of the rows of gate lines is an odd number or an even number. The first monochrome sub-pixels, the second monochrome sub-pixels and the third monochrome sub-pixels are driven by the first kind of gate lines, and the white sub-pixels are driven by the second kind of gate lines.

Further, the first kind of gate lines are odd-numbered gate lines, and the second kind of gate lines are even-numbered gate lines.

Further, the first kind of gate lines are even-numbered gate lines, and the second kind of gate lines are odd-numbered gate lines.

Further, the monochrome sub-pixels and the white sub-pixels are alternately arranged in each row of sub-pixels and in each column of sub-pixels. Each odd-numbered row of sub-pixels includes first monochrome sub-pixels, second monochrome sub-pixels and white sub-pixels, and each even-numbered row of sub-pixels includes third monochrome sub-pixels and white sub-pixels.

Further, white sub-pixels in both of a (2n−1)-th row and a 2n-th row are driven by a 2n-th gate line, monochrome sub-pixels in both of a (2n+1)-th row and the 2n-th row are driven by a (2n+1)-th gate line, and n is an integer greater than 1.

Further, one pixel unit is defined by the nearest six sub-pixels from the 2n-th row and the (2n+1)-th row, and each pixel unit includes one first monochrome sub-pixel, one second monochrome sub-pixel, one third monochrome sub-pixel, and three white sub-pixels.

Further, the nearest monochrome sub-pixels in a column direction have different colors.

Further, the monochrome sub-pixels and the white sub-pixels are alternately arranged in each row of sub-pixels and in each column of sub-pixels. Each odd-numbered row of sub-pixels includes third monochrome sub-pixels and white sub-pixels, and each even-numbered row of sub-pixels includes first monochrome sub-pixels, second monochrome sub-pixels and white sub-pixels.

Further, white sub-pixels in a (2n−1)-th row are driven by a (2n−1)-th gate line, white sub-pixels in a 2n-th row are driven by a (2n+1)-th gate line, monochrome sub-pixels in both of the (2n−1)-th row and the 2n-th row are driven by the 2n-th gate line, and n is an integer greater than 1.

Further, one pixel unit is defined by the nearest six sub-pixels from the 2n-th row and the (2n−1)-th row, and each pixel unit includes one first monochrome sub-pixel, one second monochrome sub-pixel, one third monochrome sub-pixel, and three white sub-pixels.

Further, the nearest monochrome sub-pixels in a column direction have different colors.

Further, the first monochrome sub-pixel, the second monochrome sub-pixel and the third monochrome sub-pixel are a red sub-pixel, a green sub-pixel and a blue sub-pixel, respectively; or, the first monochrome sub-pixel, the second monochrome sub-pixel and the third monochrome sub-pixel are a magenta sub-pixel, a cyan sub-pixel and a yellow sub-pixel, respectively.

According to another aspect, a display device is provided and includes the above array substrate.

Further, the display device further includes a first gate driving circuit and a second gate driving circuit. The first gate driving circuit is configured to drive monochrome sub-pixels to display, and the second gate driving circuit is configured to drive the white sub-pixels to display.

Further, the first gate driving circuit is connected with the first kind of gate lines, and the second gate driving circuit is connected with the second kind of gate lines.

Further, the first kind of gate lines are odd-numbered gate lines, and the second kind of gate lines are even-numbered gate lines.

Further, the first kind of gate lines are even-numbered gate lines, and the second kind of gate lines are odd-numbered gate lines.

Further, the first gate driving circuit and the second gate driving circuit are located at two sides of a display region of the array substrate.

Further, the display device further includes a source driving circuit which is connected with all of the date lines.

One embodiment of the present disclosure provides a method for driving the above display device, and includes: driving monochrome sub-pixels to display by controlling the first gate driving circuit to output a signal to the first kind of gate lines; and driving white sub-pixels to display by controlling the second gate driving circuit to output a signal to the second kind of gate lines.

BRIEF DESCRIPTION OF THE DRAWINGS

In order to explain the technical solutions in embodiments of the present disclosure or the related art more clearly, accompanying drawings needed in the description of the embodiments or the related art are briefly illustrated hereinafter. Apparently, the accompanying drawings described hereinafter show only some embodiments of the present disclosure, and those skilled in the art can further conceive other drawings according to the drawings without creative work.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise indicated. The implementations set forth in the following description of exemplary embodiments do not represent all implementations consistent with the disclosure. Instead, they are merely examples of devices and methods consistent with aspects related to the disclosure as recited in the appended claims.

Figure 1:
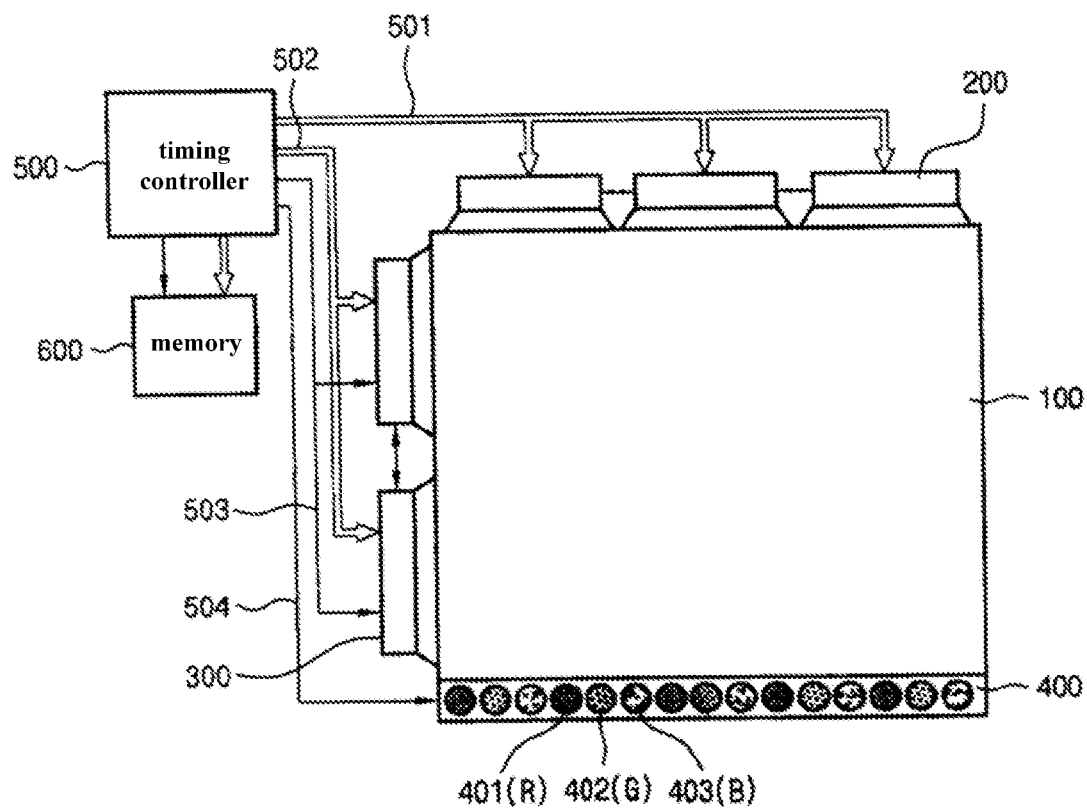
FIG. 1 is a schematic structural view of a display device in the related art.

As shown in FIG. 1, a display device in the related art includes a liquid crystal display panel 100, a source driving IC 200, a gate driver IC 300, a backlight source 400, a timing controller 500 and a memory 600.

The liquid crystal display panel 100 includes multiple gate lines and data lines intersecting with the gate lines, and thin film transistors. The thin film transistors arranged at intersection positions of the data lines and gate lines and are used to drive liquid crystal. The source driving IC 200 produces scan driving signals for driving the date lines of the liquid crystal display panel 100. The gate driver IC 300 produces signals for driving the gate lines of the liquid crystal display panel 100. The timing controller 500 produces scan driving signals for driving the gate driver IC 300, load signals for driving the source driving IC 200 as well as data signals. The memory 600 is to store and read each frame data.

In addition, in order to show RGB colors, the backlight source 400 may include multiple red LEDs 401, multiple green LEDs 402 and multiple LEDS 403.

The source driving IC 200 and the gate driver IC 300 receive a carry signal and a carry shift direction changeover signal from the timing controller 500, and shift a carry left and right (up and down). Thus, in an FSC type liquid crystal display device, one frame data is divided into R, G and B sub-frames, and each frame has ⅓ of a main-frame time.

One frame is composed of RGB sub-frames. Each sub-frame is composed of loading time, waiting time and flashing time, and corresponding color LED flashes in each sub-frame.

Figure 2:
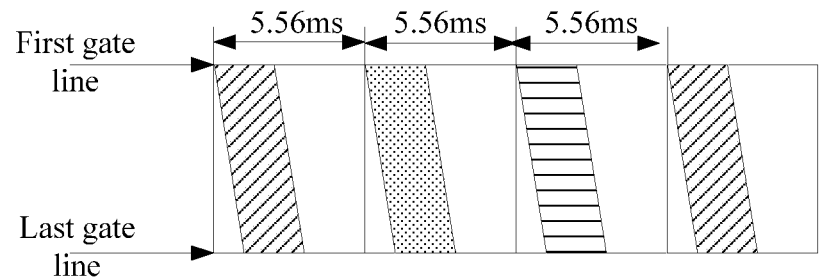
FIG. 2 is a schematic diagram of data output for the display device in the related art.

Since one frame is composed of RGB sub-frames, one sub-frame should be processed in ⅓ of the frame time, which results in that the charging time of sub-pixels is not sufficient, thereby affecting display effect of the display device. As shown in FIG. 2, when a refresh ratio of the display device is 60 Hz, for each sub-frame, it is necessary to complete outputting of scan drive signals for gate lines from the first row to the last row within 5.56 ms. Further, since the RGB sub-pixels are sequentially driven, at least 3 times of the reaction speed of liquid crystal is required. Moreover, color mixing and color break up may occur due to the low reaction speed of liquid crystal. In addition, the display device maybe affected by environment, particularly the low reaction speed of liquid crystal in low temperature.

In order to solve the above problem, embodiments of the present disclosure provide an array substrate and a display device, which can improve charging time of sub-pixels and then improve display effect of the display device.

Figure 7:
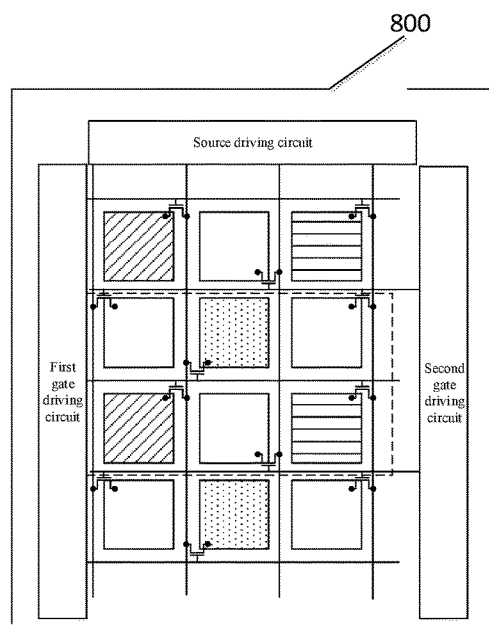
FIG. 7 is a schematic plan view of a display device according to one embodiment of the present disclosure.

One embodiment of the present disclosure provides an array substrate, which includes a base substrate (indicated by the reference number 800 shown in FIG. 7), gate lines arranged in rows on the base substrate, data lines arranged in columns on the base substrate and multiple sub-pixels. The sub-pixels are defined by the gate lines and the data lines, and are arranged in a matrix on the base substrate. The sub-pixels include first monochrome sub-pixels, second monochrome sub-pixels, third monochrome sub-pixels and white sub-pixels. Monochromatic lights emitted from one first monochrome sub-pixel, one second monochrome sub-pixel and one third monochrome sub-pixel can be mixed into white light. The monochrome sub-pixels are driven by even-numbered gate lines, and the white sub-pixels are driven by odd-numbered gate lines. Alternatively, the monochrome sub-pixels are driven by odd-numbered gate lines, and the white sub-pixels are driven by even-numbered gate lines.

In one embodiment, the white sub-pixels are added to a pixel structure, thereby improving transmittance and contrast of the display device. Further, when the display device is in work, the white sub-pixels are driven by gate lines that are different from gate lines for driving monochrome sub-pixels. In other words, the white sub-pixel and monochrome sub-pixel are driven, respectively, thereby improving charging time of sub-pixels and then improving display effect of the display device. In addition, since the white sub-pixel and monochrome sub-pixel are driven, respectively, the requirement for reaction speed of liquid crystal is reduced, thereby solving the problems of color mixing and color break up and then further improving display effect of the display device. Moreover, since the white sub-pixel and monochrome sub-pixel are driven, respectively, the sub-pixels each may be designed to have a large area under the precondition of ensuring the pixel density of the display device. When the sub-pixels each may be designed to have a large area, the amount of date lines may be reduced, thereby reducing an area occupied by a source driving circuit and then increasing an aperture ratio of the display device.

In one embodiment, in the pixel structure, the monochrome sub-pixels and the white sub-pixels are alternately arranged in each row of sub-pixels and in each column of sub-pixels.

An odd-numbered row of sub-pixels includes first monochrome sub-pixels, second monochrome sub-pixels and white sub-pixels, and an even-numbered row of sub-pixels includes third monochrome sub-pixels and white sub-pixels. Alternatively, the odd-numbered row of sub-pixels includes third monochrome sub-pixels and white sub-pixels, and the even-numbered row of sub-pixels includes first monochrome sub-pixels, second monochrome sub-pixels and white sub-pixels.

Figure 3:
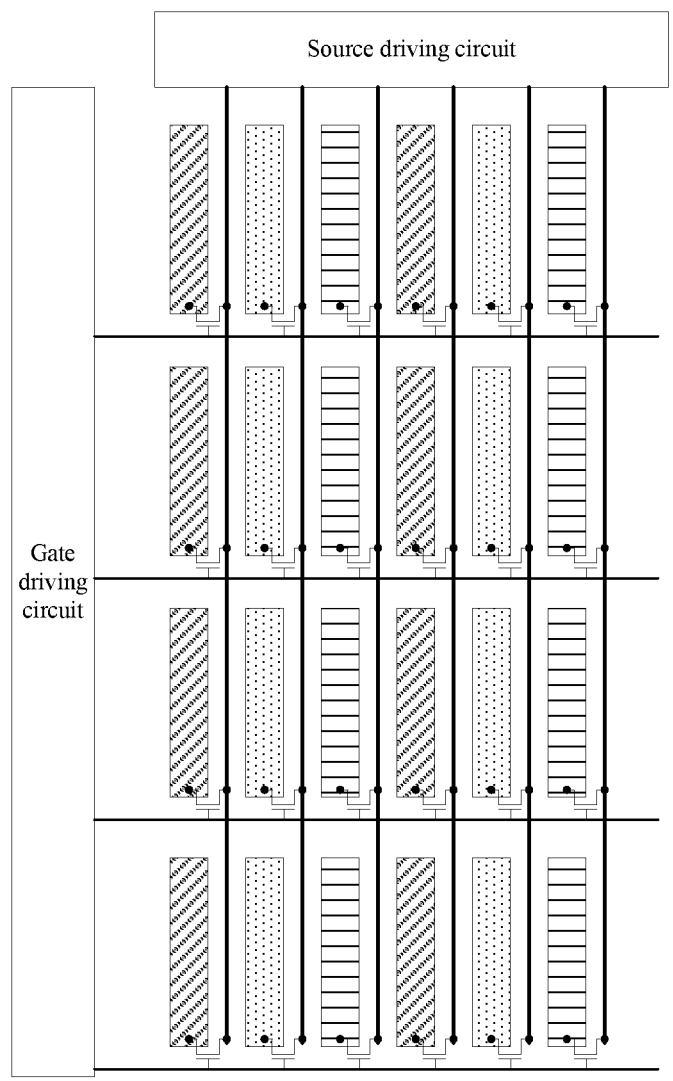
FIG. 3 is a schematic plan view of the display device in the related art.

As shown in FIG. 3, in related art, monochrome sub-pixels in an n-th row are driven by an n-th gate line. Different from the related art, in one embodiment, when the odd-numbered row of sub-pixels includes first monochrome sub-pixels, second monochrome sub-pixels and white sub-pixels and the even-numbered row of sub-pixels includes third monochrome sub-pixels and white sub-pixels, white sub-pixels in both of a (2n−1)-th row and a 2n-th row, are driven by a 2n-th gate line; monochrome sub-pixels in both of a (2n+1)-th row and a 2n-th row are driven by a (2n+1)-th gate line, and n is an integer greater than 1.

When the odd-numbered row of sub-pixels includes third monochrome sub-pixels and white sub-pixels and the even-numbered row of sub-pixels includes first monochrome sub-pixels, second monochrome sub-pixels and white sub-pixels, white sub-pixels in a (2n−1)-th row are driven by a (2n−1)-th gate line, white sub-pixels in the 2n-th row are driven by the (2n+1)-th gate line, and monochrome sub-pixels in both of a (2n−1)-th row and a 2n-th row are driven by the 2n-th gate line, and n is an integer greater than 1.

As can be seen, in one embodiment, the gate lines are divided into odd-numbered gate lines and even-numbered gate lines, and the odd-numbered gate line and the even-numbered gate line are controlled by different gate driving circuits. For one display device in the related art, when a refresh ratio of the display is 60 Hz, it is assumed that the display device includes K rows of sub-pixels, when the sub-pixels are driven by progressive scanning, the charging time for each row of sub-pixels is 1/(K*60)s. For the display device of one embodiment of the present disclosure, with respect to the odd-numbered row of sub-pixels, the charging time for the sub-pixels in the odd-numbered row is 1/[(K/2)*60]s. Thus, the charging time for the sub-pixels in the odd-numbered row is twice as long as the charging time for the sub-pixels in the display device in the related art. Similarly, the charging time for the sub-pixels in the even-numbered row is also twice as long as the charging time for the sub-pixels in the display device in the related art.

Further, when the odd-numbered row of sub-pixels includes first monochrome sub-pixels, second monochrome sub-pixels and white sub-pixels and the even-numbered row of sub-pixels includes third monochrome sub-pixels and white sub-pixels, one pixel unit is defined by the nearest six sub-pixels from the 2n-th row of sub-pixels and the (2n+1)-th row of sub-pixels. Each pixel unit includes one first monochrome sub-pixel, one second monochrome sub-pixel, one third monochrome sub-pixel, and three white sub-pixels.

When the odd-numbered row of sub-pixels includes third monochrome sub-pixels and white sub-pixels and the even-numbered row of sub-pixels includes first monochrome sub-pixels, second monochrome sub-pixels and white sub-pixels, one pixel unit is defined by the nearest six sub-pixels from the 2n-th row of sub-pixels and the (2n−1)-th row of sub-pixels. Each pixel unit includes one first monochrome sub-pixel, one second monochrome sub-pixel, one third monochrome sub-pixel, and three white sub-pixels.

Figure 4:
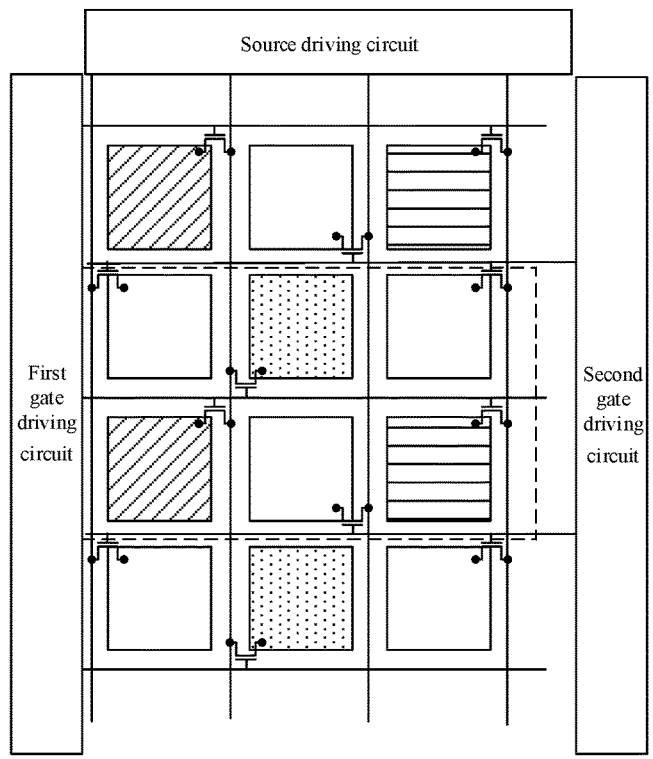
FIG. 4 is a schematic plan view of a display device according to one embodiment of the present disclosure.

As shown in FIG. 4, one pixel unit is defined by six sub-pixels in a dotted box.

Further, the nearest monochrome sub-pixels in a column direction may have different colors, thereby facilitating color modulation and then improving display quality of the display device.

Further, the first monochrome sub-pixel, the second monochrome sub-pixel and the third monochrome sub-pixel are selected from a red sub-pixel, a green sub-pixel and a blue sub-pixel.

Further, the first monochrome sub-pixel, the second monochrome sub-pixel and the third monochrome sub-pixel are selected from a magenta sub-pixel, a cyan sub-pixel and a yellow sub-pixel.

One embodiment of the present disclosure further provides a display device which includes the above array substrate. In one embodiment, since the white sub-pixel and the monochrome sub-pixel are driven by different gate lines, a first gate driving circuit and a second gate driving circuit are provided. The first gate driving circuit is to drive the monochrome sub-pixels to display. The second gate driving circuit is to drive the white sub-pixels to display.

In one embodiment shown in FIG. 4, since the white sub-pixel and the monochrome sub-pixel are driven by different gate lines, a first gate driving circuit and a second gate driving circuit are provided. The first gate driving circuit is to drive the monochrome sub-pixels to display. The second gate driving circuit is to drive the white sub-pixels to display.

Specifically, the first gate driving circuit is connected with odd-numbered gate lines, and the second gate driving circuit is connected with even-numbered gate lines.

Alternatively, the first gate driving circuit is connected with even-numbered gate lines, and the second gate driving circuit is connected with odd-numbered gate lines.

Further, the first gate driving circuit and the second gate driving circuit are located at two sides of a display region of the array substrate. If the first gate driving circuit and the second gate driving circuit are located at an identical side of the display region of the array substrate, it would adversely increase lengths of the gate lines. Therefore, lengths of the gate lines can be minimized, and then resistance of the gate lines can be reduced, thereby reducing consumption of scan drive signals.

Further, the display device further includes a source driving circuit which is connected with all of the date lines. After the first gate driving circuit and the second gate driving circuit output scan drive signals to turn on switch thin film transistors corresponding to the sub-pixels, the source driving circuit outputs a data voltage to all of the date lines to charge the sub-pixels.

One embodiment of the present disclosure further provides a method for driving the above display device. The method includes: when displaying, driving monochrome sub-pixels to display by controlling the first gate driving circuit to output a signal to a corresponding gate line; and driving white sub-pixels to display by controlling the second gate driving circuit to output a signal to a corresponding gate line.

In one embodiment, the first gate driving circuit may be connected with the even-numbered gate lines, and the second gate driving circuit may be connected with the odd-numbered gate lines, the white sub-pixels in a k-th row of pixel units are driven by a (2k−1)-th gate line and a (2k+1)-th gate line, and the monochrome sub-pixels in the k-th row of pixel units are driven by a 2k-th gate line. In this way, when the pixel units in the k-th row are driven to display, the first gate driving circuit is controlled to input a scan drive signal to the 2k-th gate line, and the second gate driving circuit is controlled to input a scan drive signal to the (2k−1)-th gate line and the (2k+1)-th gate line. When the pixel units in the (k+1)-th row are driven to display, the first gate driving circuit is controlled to input a scan drive signal to the (2k+2)-th gate line, and the second gate driving circuit is controlled to input a scan drive signal to the (2k+1)-th gate line and the (2k+3)-th gate line. When the pixel units in the (k+2)-th row are driven to display, the first gate driving circuit is controlled to input a scan drive signal to the (2k+4)-th gate line, and the second gate driving circuit is controlled to input a scan drive signal to the (2k+3)-th gate line and the (2k+5)-th gate line. As can be seen, when the pixel units in the k-th row are driven to display and when the pixel units in the (k+1)-th row are driven to display, the scan drive signal is input to the (2k+1)-th gate line, and the white sub-pixels corresponding to the (2k+1)-th gate line are charged, thereby further increasing the charging time for the white sub-pixels and improving the display effect of the display device.

Figure 5:
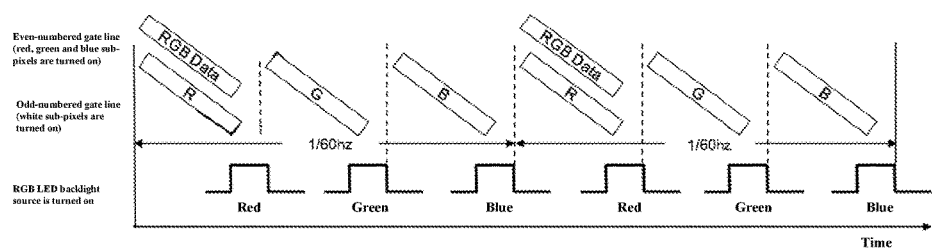
FIG. 5 is a schematic diagram of data output for the display device according to one embodiment of the present disclosure.
Figure 6:
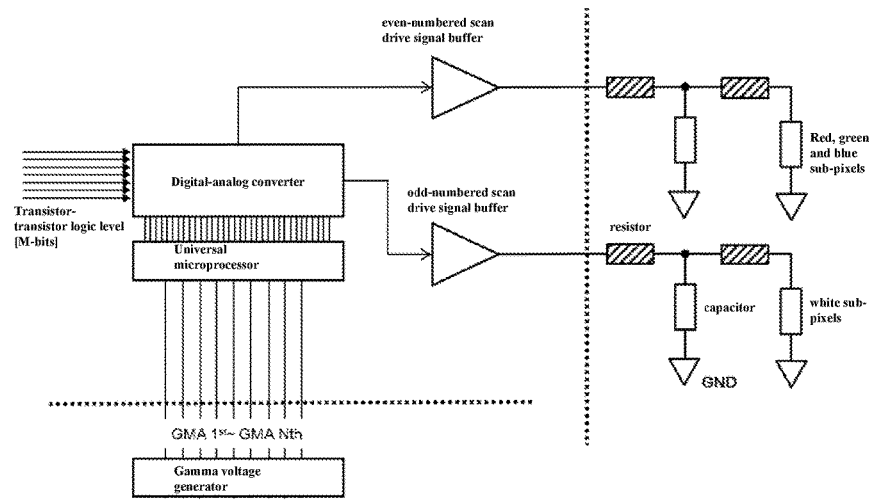
FIG. 6 is a schematic diagram of a driving circuit of the display device according to one embodiment of the present disclosure.

FIG. 5 is a schematic diagram of data output for the display device according to one embodiment of the present disclosure. FIG. 6 is a schematic diagram of a driving circuit of the display device according to one embodiment of the present disclosure. As shown in FIG. 5, the refresh ratio of the display device is 60 Hz. During the process of displaying, the backlight composed of red LEDs, green LEDs and blue LEDs, is turned on. A scan drive signal is input to the white sub-pixels at the time of inputting a scan drive signal to the red sub-pixels, the green sub-pixels and the blue sub-pixels. As shown in FIG. 6, in order to drive the white sub-pixels and the red, green and blue sub-pixels with odd-numbered gate lines and even-numbered gate lines, a buffer structure is provided in the driver IC for the odd-numbered gate lines, and another buffer structure is provided in the driver IC for the even-numbered gate lines. The even-numbered gate lines input the scan drive signal to the red, green and blue sub-pixels of the display panel. Similarly, the odd-numbered gate lines input the scan drive signal to the white sub-pixels of the display panel. Meanwhile, the RGB LEDs of the backlight source are driven in an order of red, green and blue.

Of course, the odd-numbered gate lines may input the scan drive signal to the red, green and blue sub-pixels of the display panel, and the even-numbered gate lines may input the scan drive signal to the white sub-pixels of the display panel.

In one embodiment, the white sub-pixels are added to the pixel structure, thereby improving transmittance and contrast of the display device. Further, when the display device is in work, the white sub-pixels are driven by gate lines that are different from gate lines for driving monochrome sub-pixels. In other words, the white sub-pixel and monochrome sub-pixel are driven, respectively, thereby improving charging time of sub-pixels and then improving display effect of the display device. In addition, since the white sub-pixel and monochrome sub-pixel are driven, respectively, the requirement for reaction speed of liquid crystal is reduced, thereby solving the problems of color mixing and color break up and then further improving display effect of the display device. Moreover, since the white sub-pixel and monochrome sub-pixel are driven, respectively, the sub-pixels each may be designed to have a large area under the precondition of ensuring the pixel density of the display device. When the sub-pixels each may be designed to have a large area, the amount of date lines may be reduced, thereby reducing an area occupied by the source driving circuit and then increasing an aperture ratio of the display device.

The forgoing descriptions are only optional embodiments of the present disclosure, and it should be noted that numerous improvements and substitutions may further be made by those skilled in the art without being departing from the principle of the present disclosure, and those improvements and substitutions shall fall into the scope of protection of the present disclosure.

What is claimed is:

1. An array substrate, comprising:
a base substrate,
rows of gate lines on the base substrate,
columns of data lines on the base substrate, and
an array of sub-pixels defined by the gate lines and the data lines,
wherein the sub-pixels comprise first monochrome sub-pixels, second monochrome sub-pixels, third monochrome sub-pixels and white sub-pixels, and monochromatic lights emitted from the first monochrome sub-pixels, the second monochrome sub-pixels and the third monochrome sub-pixels are capable of being mixed into white light;
wherein the gate lines are divided into a first kind of gate lines and a second kind of gate lines depending on whether an ordinal number of each of the rows of gate lines is an odd number or an even number, and
wherein the first monochrome sub-pixels, the second monochrome sub-pixels and the third monochrome sub-pixels are driven by the first kind of gate lines, and the white sub-pixels are driven by the second kind of gate lines;
wherein the monochrome sub-pixels and the white sub-pixels are alternately arranged in each row of sub-pixels and in each column of sub-pixels,
wherein each odd-numbered row of sub-pixels comprises first monochrome sub-pixels, second monochrome sub-pixels and white sub-pixels, and each even-numbered row of sub-pixels comprises third monochrome sub-pixels and white sub-pixels.

2. The array substrate of claim 1, wherein the first kind of gate lines are odd-numbered gate lines, and the second kind of gate lines are even-numbered gate lines.

3. The array substrate of claim 1, wherein the first kind of gate lines are even-numbered gate lines, and the second kind of gate lines are odd-numbered gate lines.

4. The array substrate of claim 1, wherein white sub-pixels in both of a (2n−1)-th row and a 2n-th row are driven by a 2n-th gate line, monochrome sub-pixels in both of a (2n+1)-th row and the 2n-th row are driven by a (2n+1)-th gate line, and n is an integer greater than 1.

5. The array substrate of claim 4, wherein one pixel unit is defined by the nearest six sub-pixels from the 2n-th row and the (2n+1)-th row, and each pixel unit comprises one first monochrome sub-pixel, one second monochrome sub-pixel, one third monochrome sub-pixel and three white sub-pixels.

6. The array substrate of claim 1, wherein the nearest monochrome sub-pixels in a column direction have different colors.

7. The array substrate of claim 1, wherein the first monochrome sub-pixel, the second monochrome sub-pixel and the third monochrome sub-pixel are a red sub-pixel, a green sub-pixel and a blue sub-pixel, respectively; or,
the first monochrome sub-pixel, the second monochrome sub-pixel and the third monochrome sub-pixel are a magenta sub-pixel, a cyan sub-pixel and a yellow sub-pixel, respectively.

8. An array substrate, comprising:
a base substrate,
rows of gate lines on the base substrate,
columns of data lines on the base substrate, and
an array of sub-pixels defined by the gate lines and the data lines,
wherein the sub-pixels comprise first monochrome sub-pixels, second monochrome sub-pixels, third monochrome sub-pixels and white sub-pixels, and monochromatic lights emitted from the first monochrome sub-pixels, the second monochrome sub-pixels and the third monochrome sub-pixels are capable of being mixed into white light;
wherein the gate lines are divided into a first kind of gate lines and a second kind of gate lines depending on whether an ordinal number of each of the rows of gate lines is an odd number or an even number, and
wherein the first monochrome sub-pixels, the second monochrome sub-pixels and the third monochrome sub-pixels are driven by the first kind of gate lines, and the white sub-pixels are driven by the second kind of gate lines;
wherein the monochrome sub-pixels and the white sub-pixels are alternately arranged in each row of sub-pixels and in each column of sub-pixels,
wherein each odd-numbered row of sub-pixels comprises third monochrome sub-pixels and white sub-pixels, and each even-numbered row of sub-pixels comprises first monochrome sub-pixels, second monochrome sub-pixels and white sub-pixels.

9. The array substrate of claim 8, wherein white sub-pixels in a (2n−1)-th row are driven by a (2n−1)-th gate line, white sub-pixels in a 2n-th row are driven by a (2n+1)-th gate line, monochrome sub-pixels in both of the (2n−1)-th row and the 2n-th row are driven by a 2n-th gate line, and n is an integer greater than 1.

10. The array substrate of claim 9, wherein one pixel unit is defined by the nearest six sub-pixels from the 2n-th row and the (2n−1)-th row, and each pixel unit comprises one first monochrome sub-pixel, one second monochrome sub-pixel, one third monochrome sub-pixel and three white sub-pixels.

11. The array substrate of claim 8, wherein the nearest monochrome sub-pixels in a column direction have different colors.

12. A display device, comprising an array substrate,
wherein the array substrate comprises:
a base substrate,
rows of gate lines on the base substrate,
columns of data lines on the base substrate, and
an array of sub-pixels defined by the gate lines and the data lines,
wherein the sub-pixels comprise first monochrome sub-pixels, second monochrome sub-pixels, third monochrome sub-pixels and white sub-pixels, and monochromatic lights emitted from the first monochrome sub-pixels, the second monochrome sub-pixels and the third monochrome sub-pixels are capable of being mixed into white light;
wherein the gate lines are divided into a first kind of gate lines and a second kind of gate lines depending on whether an ordinal number of each of the rows of gate lines is an odd number or an even number, and
wherein the first monochrome sub-pixels, the second monochrome sub-pixels and the third monochrome sub-pixels are driven by the first kind of gate lines, and the white sub-pixels are driven by the second kind of gate lines;
wherein the display device further includes a first gate driving circuit and a second gate driving circuit, wherein the first gate driving circuit is configured to drive monochrome sub-pixels to display, and the second gate driving circuit is configured to drive the white sub-pixels to display.

13. The display device of claim 12, wherein the first gate driving circuit is connected with the first kind of gate lines, and the second gate driving circuit is connected with the second kind of gate lines.

14. The display device of claim 13, wherein the first kind of gate lines are odd-numbered gate lines, and the second kind of gate lines are even-numbered gate lines.

15. The display device of claim 13, wherein the first kind of gate lines are even-numbered gate lines, and the second kind of gate lines are odd-numbered gate lines.

16. The display device of claim 12, wherein the first gate driving circuit and the second gate driving circuit are located at two sides of a display region of the array substrate.

17. The display device of claim 16, further comprising a source driving circuit which is connected with all of the date lines.

18. A method for driving the display device of claim 12, comprising:
driving monochrome sub-pixels to display by controlling the first gate driving circuit to output a signal to the first kind of gate lines; and
driving white sub-pixels to display by controlling the second gate driving circuit to output a signal to the second kind of gate lines.

* * * * *